US010862487B2

(12) United States Patent
Kumar et al.

(10) Patent No.: US 10,862,487 B2
(45) Date of Patent: *Dec. 8, 2020

(54) LOCKED LOOP CIRCUIT WITH REFERENCE SIGNAL PROVIDED BY UN-TRIMMED OSCILLATOR

(71) Applicant: STMicroelectronics International N.V., Schiphol (NL)

(72) Inventors: Anand Kumar, Noida (IN); Nitin Gupta, Kurukshetra (IN); Nitin Jain, Ghaziabad (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/674,207

(22) Filed: Nov. 5, 2019

(65) Prior Publication Data
US 2020/0076437 A1 Mar. 5, 2020

Related U.S. Application Data

(63) Continuation of application No. 15/475,274, filed on Mar. 31, 2017, now Pat. No. 10,505,552.

(51) Int. Cl.
| | |
|---|---|
| *H03L 1/00* | (2006.01) |
| *H03L 7/183* | (2006.01) |
| *H03L 7/087* | (2006.01) |
| *H03L 7/085* | (2006.01) |

(52) U.S. Cl.
CPC .............. *H03L 1/00* (2013.01); *H03L 7/087* (2013.01); *H03L 7/183* (2013.01); *H03L 7/085* (2013.01)

(58) Field of Classification Search
CPC ..... H03L 7/00; H03L 7/06; H03L 7/07; H03L 7/08; H03L 7/099; H03L 7/0991; H03L 7/0992; H03L 7/16; H03L 7/18; H03L 7/183; H03L 7/187; H03L 7/193; H03L 7/195; H03L 7/22; H03L 2207/50
USPC .................................................. 327/156–158
See application file for complete search history.

(56) References Cited

U.S. PATENT DOCUMENTS

| | | | |
|---|---|---|---|
| 7,180,377 B1 * | 2/2007 | Leong | H03L 7/087 327/157 |
| 7,605,662 B2 | 10/2009 | Kobayashi et al. | |
| 8,755,479 B2 | 6/2014 | Vavelidis et al. | |
| 2005/0068119 A1 | 3/2005 | Uozumi et al. | |
| 2017/0328870 A1 | 11/2017 | Garlepp et al. | |

* cited by examiner

*Primary Examiner* — Diana J. Cheng
(74) *Attorney, Agent, or Firm* — Crowe & Dunlevy

(57) ABSTRACT

A circuit includes a frequency detector generating a comparison signal as a function of a comparison between a reference signal and a feedback signal. An oscillator generates an output signal as a function of the comparison signal. A frequency divider, in operation, divides the output signal by a division value to produce the feedback signal as having a frequency that is a multiple of a frequency of the reference signal. A frequency counter circuit measures the frequency of the reference signal and generates a count signal based thereupon. A control circuit adjusts the division value used by the frequency divider, in operation, based upon the count signal.

17 Claims, 2 Drawing Sheets

LOCKED LOOP CIRCUIT WITH REFERENCE SIGNAL PROVIDED BY UN-TRIMMED OSCILLATOR

RELATED APPLICATION

This is a continuation of United Stated application for U.S. patent Ser. No. 15/475,274, filed Mar. 31, 2017, the contents of which are incorporated by reference in their entirety.

TECHNICAL FIELD

This disclosure is directed to the field of locked loop circuits and, in particular, to locked loop circuits capable of self-adjusting for process variations in oscillators providing reference frequencies used by those locked loop circuits.

BACKGROUND

A locked loop circuit operates to produce an output signal having a frequency that is a multiple, or fraction, of a reference frequency. In some cases, the reference frequency may be provided by a crystal oscillator. While a crystal oscillator can accurately generate the reference frequency, it may be undesirably expensive, and may consume an undesirable amount of area.

Therefore, an RC oscillator may be used to generate the reference frequency for a locked loop circuit. However, due to process variations in fabrication of resistors and capacitors, an RC oscillator without a feedback mechanism may inaccurately generate such the reference frequency, which would result in the locked loop circuit employing that RC oscillator not actually generating its output signal as having a desired frequency.

Consequently, an RC oscillator used with a locked loop circuit will conventionally employ a feedback loop, calibration, or compensation circuit and be adjusted based thereupon. A digital to analog converter (DAC) is employed to generate control signals for components within the RC oscillator. By adjusting the operation of these components, the frequency of the signal generated by the RC oscillator may be adjusted.

Unfortunately, to obtain a high degree of accuracy in feedback signal generation with an RC oscillator, the DAC utilizes a large number of bits as input, resulting in the DAC being undesirably large and consuming an undesirable amount of area. In addition, a large DAC can consume an undesirable amount of power.

Therefore, further development in the area of locked loop circuits is needed to address these issues.

SUMMARY

Disclosed herein is an electronic device including a locked loop circuit configured to receive a reference signal, and to generate therefrom an output signal, with the output signal having a frequency that is a fractional or integer multiple of a frequency of the reference signal. A frequency counter circuit is configured to measure the frequency of the reference signal and to generate a count signal based thereupon. A control circuit is configured to adjust a multiplier used by the locked loop circuit to generate the output signal based upon the count signal.

The control circuit may be configured to adjust the multiplier such that the frequency of the output signal matches a desired frequency. The frequency of the reference signal may not be equal to a desired reference frequency, and the control circuit may be configured to adjust the multiplier such that the frequency of the output signal is equal to the desired reference frequency multiplied by a desired multiplier.

The frequency counter circuit may measure the frequency of the reference signal by counting pulses of the reference signal over a time period based upon a desired accuracy of the frequency of the output signal. The time period may be equal to a number of cycles of a calibration frequency equal in number to 1 divided by a desired accuracy threshold.

An oscillator may generate the reference signal in an un-trimmed manner. The oscillator does not contain a digital to analog converter and is not a crystal oscillator.

The locked loop circuit may be a phase locked loop circuit or a frequency locked loop circuit or any other frequency multiplier circuit.

Also disclosed herein is a circuit including a frequency detector configured to generate a comparison signal as a function of a comparison between a reference signal and a feedback signal, and an oscillator configured to generate an output signal as a function of the comparison signal. A frequency divider is configured to, in operation, divide the output signal by a division value to produce the feedback signal as having a frequency that is a multiple of a frequency of the reference signal. A frequency counter circuit is configured to measure the frequency of the reference signal and to generate a count signal based thereupon. A control circuit is configured to adjust the division value used by the frequency divider in operation, based upon the count signal.

The frequency counter circuit may be configured to determine the frequency of the reference signal by comparing the reference signal to a calibration signal. The frequency counter circuit may compare the reference signal to the calibration signal by counting a number of pulses in the reference signal over a time window measured in clock cycles of the calibration signal. The time window may be equal to a number of clock cycles of the calibration signal equal to 100 divided by a desired accuracy percentage. The count signal may be equal to 100 divided by the desired accuracy percentage, multiplied by the determined frequency of the reference signal, divided by a frequency of the calibration signal.

The frequency of the reference signal is not equal to a desired reference frequency, and the control circuit may be configured to adjust the division value such that the frequency of the output signal is equal to the desired reference frequency multiplied by a desired multiplier.

The RC oscillator may generate the reference signal in an un-trimmed manner.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

Figure 1:
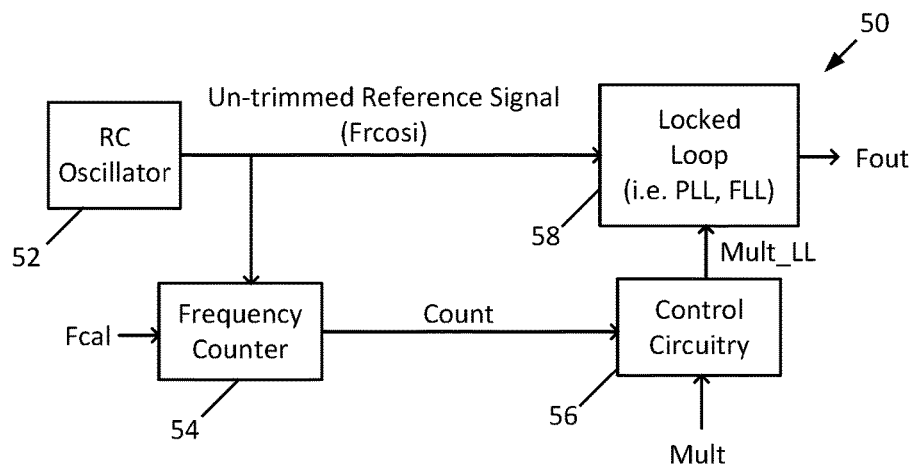
FIG. 1 is a block diagram of an electronic device including a locked loop circuit in accordance with this disclosure.

With initial reference to FIG. 1, an electronic device 50 is now described. This electronic device 50 may be, or may be incorporated within, a mobile electronic device such as a smartphone, tablet, smartwatch, or wearable. In some cases, the electronic device 50 may form part of a single integrated circuit chip, or may form part of a single package or single module.

The electronic device 50 includes a locked loop 58, which operates to generate an output signal Fout having a frequency $f_{out}$ that is a fractional or integer multiple of a frequency $f_{ref}$ of a reference signal Frcosi. A RC oscillator 52 provides the reference signal Frcosi to the locked loop 58. As will be explained in greater detail below, the frequency of the reference signal Frcosi may be inaccurate in that the frequency $f_{actual}$ of Frcosi may not be the frequency $f_{intended}$ that Frcosi is intended (for example, by design) to have. A frequency counter 54 measures the actual frequency $f_{actual}$ of the reference signal Frcosi in comparison to a comparison frequency $f_{calibrate}$ of a calibration signal Fcal, and generates an output Count to control circuitry 56. The control circuitry 56 receives a desired fractional or integer multiplier Mult as an input, and adjusts the multiplier Mult_LL actually used by the locked loop 58, based upon Count, so that the frequency $f_{out}$ of the output signal Fout is actually equal to $f_{intended}$*MUlt.

Stated another way, the reference signal Frcosi is intended (or designed) to have the frequency $f_{intended}$, but actually (as built or implemented) has the frequency $f_{actual}$. The desired multiplier for $f_{intended}$ is Mult. The desired frequency $f_{out}$ for the output signal Fout is therefore $f_{intended}$*Mult. However, since Frcosi actually has the frequency the frequency $f_{out}$ of the $f_{actual}$, output signal Fout would be $f_{actual}$*Mult, which is not equal to $f_{intended}$*Mult. Therefore, the control circuitry 56 adjusts the multiplier Mult_LL used by the locked loop 58, such that the output signal Fout has a frequency $f_{out}$ of $f_{actual}$*Mult_LL, which is equal to $f_{intended}$*MUlt.

The RC oscillator 52 generates the reference signal Frcosi in an "un-trimmed" fashion. As will be understood by those of skill in the art, "un-trimmed" means that output of the RC oscillator 52 is not adjusted for process variations. As will also be understood by those of skill in the art, a RC oscillator, such as the RC oscillator 52, requires some form of feedback, calibration, or compensation in order to precisely generate a signal having a desired frequency. Without that feedback, calibration, or compensation the frequency of the generated signal may be too high or too low, potentially by a large amount (i.e., 20%). Such mechanisms typically involve a digital to analog converter (DAC) used to precisely control current sources within the RC oscillator to compensate for the fact that the actual resistance of the resistors and the actual capacitance of the capacitors is not the intended resistance and the intended capacitance and thereby ensure that the generated signal has the desired frequency.

Is therefore made explicitly clear here that the RC oscillator 52 uses no feedback, calibration, or compensation mechanisms, uses no digital to analog converter, and generates its output signal Frcosi having an actual frequency $f_{actual}$ that is not equal to the desired frequency $f_{intended}$, and is instead higher or lower than $f_{intended}$. There are no mechanisms to correct Frcosi itself, and Frcosi remains uncorrected. Thus, it is also made explicitly clear that the locked loop 58 may not receive a reference signal Frcosi having the intended frequency $f_{intended}$, but instead may receive the reference signal Frcosi having the incorrect and undesired frequency $f_{actual}$, as the RC oscillator 52 is free running and un-trimmed.

The frequency counter 54 determines the actual frequency $f_{actual}$ of the reference signal Frcosi by counting the number of pulses in Frcosi over a window time measured in clock cycles of Fcal and related to a desired accuracy of the frequency. The desired accuracy can be represented as a percentage, and in that case, the time window has a duration of 100/DesiredAccuracy clock cycles, referred to as Count_Ref. For example, if the desired accuracy is 0.1%, then the window has a duration of 100/0.1=1000 cycles at a frequency of Fintended. Therefore, if the frequency counter 54 counts 800 cycles (where the desired accuracy is 0.1%), it is known that $f_{actual}$ is 20% less than $f_{desired}$, within an accuracy of 0.1%.

The output Count generated by the frequency counter 54 is thus a digital representation of: Count=Count_Ref*$f_{actual}$/$f_{intended}$.

The control circuitry 56 receives Count, and then calculates the multiple Mult_LL to be used by the locked loop 58 as:

$$MMult\_LL=(Count\_Ref/Count)*Mult=f_{intended}*Mult/f_{actual}.$$

Therefore, the frequency of Fout will be $f_{out}=f_{actual}$*Mult_LL=$f_{intended}$*Mult. Thus, the electronic device 50 has realized an accurate locked loop circuit 58 that receives its reference frequency from an un-trimmed RC oscillator 52. By using the un-trimmed RC oscillator 52, the amount of surface area consumed by the RC oscillator 52 is greatly reduced, as the digital to analog converters utilized in trimmed RC oscillators can consume as much, or more than, 70% of the available surface area. In addition, power consumption is reduced due to the lack of trimming.

In addition, since there is no surface area penalty for increasing the accuracy of the output signal Fout from the locked loop 58, the frequency of the reference signal Frcosi can be greatly reduced and Mult_LL can be increased accordingly to produce the desired output frequency $f_{out}$. This helps to further reduce power consumption. Moreover, the effect of temperature on the reference signal Frcosi is reduced by the reduction in frequency, as is the effect of transient switching.

It should be understood that the locked loop 58 which may be a frequency locked loop or a phase locked loop, and may be constructed from entirely analog components or a combination of analog or digital components. In the case where the locked loop 58 is a frequency locked loop, the locked loop 58 operates to generate an output signal Fout that has a frequency $f_{out}$ that is a desired multiple Mult of a desired frequency $f_{intended}$ of a reference signal Frcosi, and in the case where the locked loop 58 is a phase locked loop, in addition to the output signal Fout having a frequency $f_{out}$ that is the desired multiple Mult of the desired frequency $f_{intended}$ of the reference signal Frcosi, the phase of the output signal Fout is locked to the phase of the reference signal Frcosi.

Figure 2:
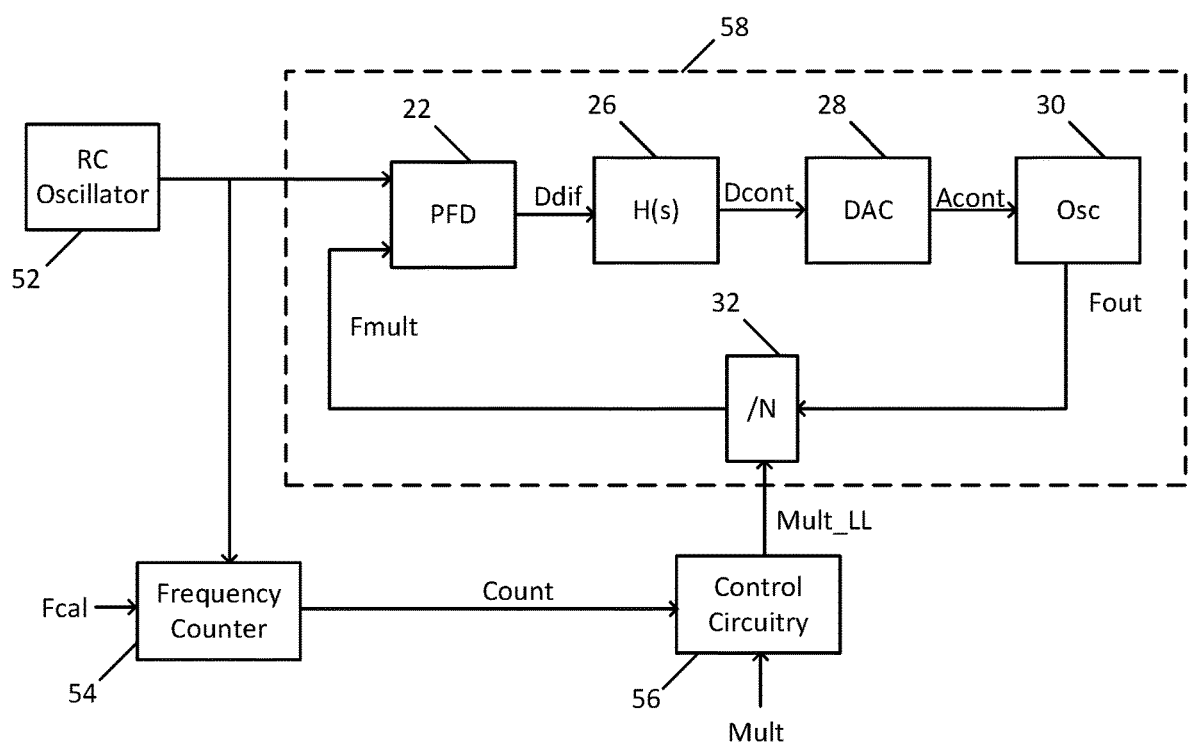
FIG. 2 is a schematic block diagram of an electronic device including a digital phase locked loop circuit in accordance with this disclosure.

An embodiment in which the locked loop 58 is a digital phase locked loop is now described with reference to FIG. 2. Operation of the RC oscillator 52, frequency counter 54, and control circuitry 56 remains the same as above and will not be repeated for brevity. Here, the locked loop 58 includes a phase frequency detector (PFD) 22. The PFD 22 receives as input the reference signal Frcosi and a feedback signal Fmult. The PFD 22 determines a difference in phase between the reference frequency signal Frcosi and the feedback signal Fmult and outputs a digital signal Ddif indicative of that measured difference. The digital signal Ddif is filtered by digital filter 26, such as a low pass digital filter, which generates a control signal Dcont. A digital-to-analog converter (DAC) 28 converts the digital control signal Dcont to an analog control signal Acont. A control input of an oscillator circuit 30, such as a voltage controlled oscillator or current controlled oscillator, receives the analog control signal Acont and generates an output clock signal Fout having a frequency $f_{out}$ that is dependent on the magnitude of the analog control signal Acont. A divider circuit (/N) 32 divides the output clock signal Fout by N (equal to Mult_LL) to generate a feedback signal Fmult.

Figure 3:
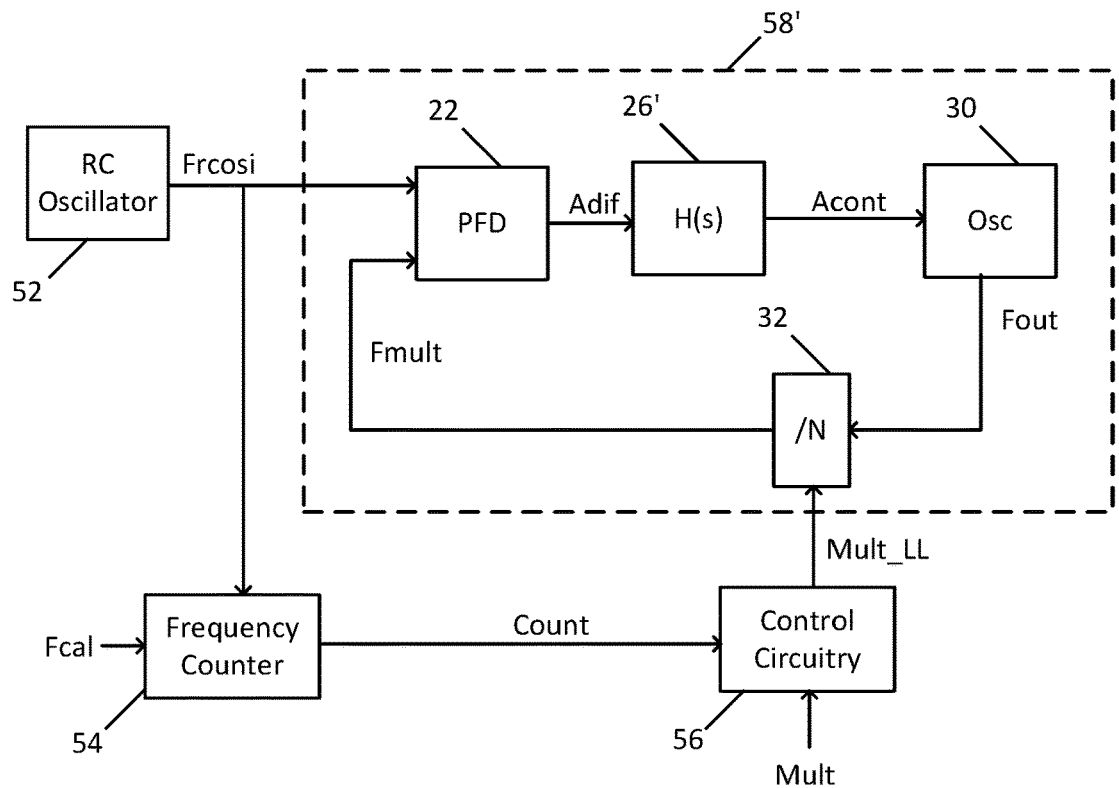
FIG. 3 is a schematic block diagram of an electronic device including an analog phase locked loop circuit in accordance with this disclosure.

An embodiment in which the locked loop 58' is an analog phase locked loop is now described with reference to FIG. 3. Operation of the RC oscillator 52, frequency counter 54, and control circuitry 56 remains the same as above and will not be repeated for brevity. Here, the locked loop 58' includes a phase frequency detector (PFD) 22. The PFD 22 receives as input the reference signal Frcosi and a feedback signal Fmult. The PFD 22 determines a difference in phase between the reference frequency signal Frcosi and the feedback signal Fmult and outputs an analog signal Adif indicative of that measured difference. The analog signal Adif is filtered by filter 26', such as a low pass analog filter, which generates a control signal Acont. A control input of an oscillator circuit 30, such as a voltage controlled oscillator or current controlled oscillator, receives the analog control signal Acont and generates an output clock signal Fout having a frequency $f_{out}$ that is dependent on the magnitude of the analog control signal Acont. A divider circuit (/N) 32 divides the output clock signal Fosc by N (equal to Mult_LL) to generate a feedback signal Fmult.

Figure 4:
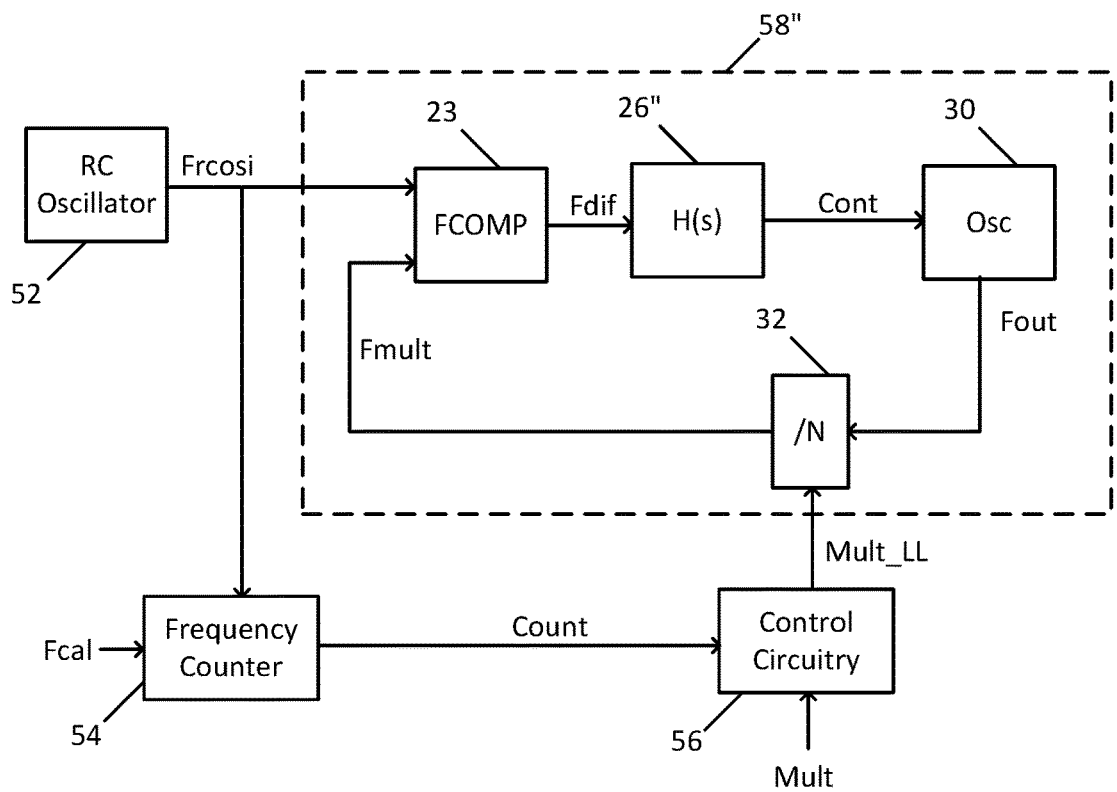
FIG. 4 is a schematic block diagram of an electronic device including an analog frequency locked loop circuit in accordance with this disclosure.

An embodiment in which the locked loop 58" is an analog frequency locked loop is now described with reference to FIG. 4. Operation of the RC oscillator 52, frequency counter 54, and control circuitry 56 remains the same as above and will not be repeated for brevity. Here, the locked loop 58" includes a frequency comparator 22. The frequency comparator 22 receives as input the reference signal Frcosi and the feedback signal Fmult. The frequency comparator 22 determines a difference in frequency between the reference frequency signal Frcosi and the feedback signal Fmult and outputs an analog signal Fdif indicative of that measured difference. The analog signal Fdif is filtered by filter 26", such as a low pass analog filter, which generates a control signal Cont. A control input of an oscillator circuit 30, such as a voltage controlled oscillator or current controlled oscillator, receives the control signal Cont and generates an output clock signal Fout having a frequency $f_{out}$ that is dependent on the magnitude of the control signal Cont. A divider circuit (/N) 32 divides the output clock signal Fout by N (equal to Mult_LL) to generate a feedback signal Fmult.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit, comprising:
 a frequency detector configured to generate a comparison signal as a function of a comparison between a reference signal and a feedback signal;
 an oscillator configured to generate an output signal as a function of the comparison signal;
 a frequency divider configured to divide the output signal by a division value to generate the feedback signal as being a divided frequency version of the output signal having a frequency that is a multiple of a frequency of the reference signal;
 a frequency counter circuit configured to measure the frequency of the reference signal and to generate a count signal based thereupon; and
 a control circuit configured to adjust the division value used by the frequency divider, in operation, based upon the count signal.

2. The circuit of claim 1, wherein the frequency counter circuit is configured to determine the frequency of the reference signal by comparing the reference signal to a calibration signal.

3. The circuit of claim 2, wherein the frequency counter circuit compares the reference signal to the calibration signal by counting a number of pulses in the reference signal over a time window measured in clock cycles of the calibration signal.

4. The circuit of claim 3, wherein the time window is equal to a number of clock cycles of the calibration signal equal to 100 divided by a desired accuracy percentage.

5. The circuit of claim 4, wherein the count signal is equal to 100 divided by the desired accuracy percentage, multiplied by the determined frequency of the reference signal, divided by a frequency of the calibration signal.

6. The circuit of claim 1, wherein the frequency counter circuit is not operated based upon the feedback signal and does not measure a frequency of the feedback signal.

7. The circuit of claim 1, wherein the frequency counter circuit is not directly electrically connected to the feedback signal.

8. The circuit of claim 1, wherein the frequency of the reference signal is not equal to a desired reference frequency; and wherein the control circuit is configured to adjust the division value such that the frequency of the output signal is equal to the desired reference frequency multiplied by a desired multiplier.

9. The circuit of claim 1, further comprising an RC oscillator generating the reference signal in an un-trimmed manner.

10. The circuit of claim 1, wherein the circuit is configured to define a digital phase locked loop; wherein the reference signal comprises an analog reference signal, the feedback signal comprises an analog feedback signal, and the comparison signal comprises an analog comparison signal; wherein the frequency detector comprises a digital phase frequency detector that generates a digital comparison signal as a function of a comparison between the analog reference signal and the analog feedback signal; and further comprising a digital to analog converter configured to convert the digital comparison signal to the analog comparison signal.

11. The circuit of claim 1, wherein the circuit is configured to define an analog phase locked loop; wherein the reference signal comprises an analog reference signal; wherein the feedback signal comprises an analog feedback signal; and wherein the comparison signal comprises an analog comparison signal.

12. A method, comprising:
- generating a comparison signal as a function of a comparison between a reference signal and a feedback signal;
- generating an output signal as a function of the comparison signal;
- dividing the output signal by a non-zero division value to produce the feedback signal as having a frequency that is a multiple of a frequency of the reference signal;
- measuring the frequency of the reference signal and generating a count signal based thereupon; and
- adjusting the non-zero division value, based upon the count signal.

13. The method of claim 12, wherein the frequency of the reference signal is determined by comparing the reference signal to a calibration signal.

14. The method of claim 13, wherein comparing the reference signal to the calibration signal comprises counting a number of pulses in the reference signal over a time window measured in clock cycles of the calibration signal.

15. The method of claim 14, wherein the time window is equal to a number of clock cycles of the calibration signal equal to 100 divided by a desired accuracy percentage.

16. The method of claim 15, wherein the count signal is equal to 100 divided by the desired accuracy percentage, multiplied by the determined frequency of the reference signal, divided by a frequency of the calibration signal.

17. The method of claim 12, further comprising generating the reference signal using an RC oscillator.

\* \* \* \* \*